(12) United States Patent
Crane, Jr. et al.

(10) Patent No.: US 6,709,891 B2
(45) Date of Patent: Mar. 23, 2004

(54) OPEN-CAVITY SEMICONDUCTOR DIE PACKAGE

(75) Inventors: Sanford W. Crane, Jr., Boca Raton, FL (US); Lakshminarasimha Krishnapura, Delray Beach, FL (US); Yun Li, Boca Raton, FL (US)

(73) Assignee: Silicon Bandwidth Inc., San Jose, CA (US)

( * ) Notice: Subject to any disclaimer, the term of this patent is extended or adjusted under 35 U.S.C. 154(b) by 0 days.

(21) Appl. No.: 10/231,347

(22) Filed: Aug. 30, 2002

(65) Prior Publication Data

US 2003/0003626 A1 Jan. 2, 2003

Related U.S. Application Data

(62) Division of application No. 09/950,702, filed on Sep. 13, 2001, which is a division of application No. 09/218,180, filed on Dec. 22, 1998, now Pat. No. 6,307,258.

(51) Int. Cl.[7] .......................... H01L 21/44; H01L 21/48; H01L 21/50
(52) U.S. Cl. .......................... 438/110; 438/116; 438/125
(58) Field of Search .............................. 438/110, 116, 438/121, 123, 125; 257/680, 690, 704, 730

(56) References Cited

U.S. PATENT DOCUMENTS

| | | | |
|---|---|---|---|
| 4,167,647 A | 9/1979 | Salera | 174/52 |
| 4,331,831 A | 5/1982 | Ingram et al. | 174/52 |
| 4,437,718 A | 3/1984 | Selinko | 339/61 |
| 4,616,406 A | 10/1986 | Brown | 29/588 |
| 4,616,416 A | 10/1986 | Cabaud | 29/884 |
| 4,649,229 A | 3/1987 | Scherer et al. | 174/52 |
| 4,654,472 A | 3/1987 | Goldfarb | 174/52 |
| 4,675,472 A | 6/1987 | Krumme et al. | 174/52 |
| 4,705,917 A | 11/1987 | Gates, Jr. et al. | 174/52 |
| 4,879,808 A | 11/1989 | Smith et al. | 29/845 |

(List continued on next page.)

FOREIGN PATENT DOCUMENTS

| | | |
|---|---|---|
| EP | 0 155 044 | 9/1985 |
| EP | 0786745 | 7/1997 |
| EP | 0789334 | 8/1997 |
| JP | 61082447 | 4/1986 |
| JP | 1074795 | 3/1989 |
| JP | 2301182 | 12/1990 |
| JP | 5226803 | 9/1993 |

OTHER PUBLICATIONS

Intel Corporation, Packaging.
Rao R. Tummala, Microelectronics Packaging Handbook, Foreword, Chapters 11 (Package–To–Board Interconnections, and 12 (Printed–Circuit Board Packaging), New York, Van Nostrand Reinhold, ©1989.

Primary Examiner—Amir Zarabian
Assistant Examiner—Jamie L. Brophy
(74) Attorney, Agent, or Firm—Morgan, Lewis & Bockius LLP (57) ABSTRACT

A semiconductor die carrier includes a housing that defines a cavity for holding one or more semiconductor dies, electrically conductive leads, and a cover plate having an aperture formed therethrough. The housing includes insulative side walls and a end plate joined to the side walls. The side walls and the end plate may be molded together as a one-piece unit. One or more of the side walls includes openings for receiving the leads so that an internal lead section extends within the cavity and an external lead section extends from the side walls external of the housing. The side walls may include a recess for receiving the cover plate. The aperture in the cover plate allows a semiconductor die held in the housing to be exposed to the environment.

11 Claims, 8 Drawing Sheets

U.S. PATENT DOCUMENTS

| | | | |
|---|---|---|---|
| 4,991,291 A | 2/1991 | Koepke et al. | 29/884 |
| 5,008,734 A | 4/1991 | Dutta et al. | 357/74 |
| 5,022,144 A | 6/1991 | Hingorany | 29/854 |
| 5,207,102 A | 5/1993 | Takahashi et al. | 73/727 |
| 5,414,293 A | 5/1995 | Broom | 257/433 |
| 5,622,873 A | 4/1997 | Kim et al. | 438/65 |
| 5,773,323 A | 6/1998 | Hur | 438/121 |
| 5,861,602 A * | 1/1999 | Cox et al. | 219/121.64 |
| 5,897,338 A | 4/1999 | Kaldenberg | 216/33 |
| 5,945,727 A | 8/1999 | Ishiwa | 257/666 |
| 6,078,102 A | 6/2000 | Crane, Jr. | 257/693 |
| 6,331,452 B1 | 12/2001 | Gall | 438/119 |

\* cited by examiner

OPEN-CAVITY SEMICONDUCTOR DIE PACKAGE

RELATED APPLICATIONS

This is a divisional of application Ser. No. 09/950,702 filed on Sep. 13, 2001, which is a divisional of application Ser. No. 09/218,180, filed on Dec. 22, 1998, now U.S. Pat. No. 6,307,258.

This application is related in subject matter to U.S. application Ser. No. 08/208,586, entitled "Prefabricated Semiconductor Chip Carrier", filed Mar. 11, 1994, and expressly incorporated by reference herein; U.S. application Ser. No. 08/465,146, entitled "Method of Manufacturing A Semiconductor Chip Carrier", filed Jun. 5, 1995, and expressly incorporated by reference herein; U.S. application Ser. No. 08/487,103, entitled "Semiconductor Die Carrier Having Double-Sided Die Attach Plate", filed Jun. 7, 1995, and expressly incorporated by reference herein; U.S. application Ser. No. 08/902,032, entitled "Semiconductor Die Carrier Having A Dielectric Epoxy Between Adjacent Leads", filed Jul. 29, 1997, which is a continuation of U.S. application Ser. No. 08/487,100, filed Jun. 7, 1995, and expressly incorporated by reference herein; U.S. application Ser. No. 08/482,00, entitled "Low Profile Semiconductor Die Carrier", filed Jun. 7, 1995, and expressly incorporated by reference herein; U.S. patent application Ser. No. 08/970,379, entitled "Multi-Chip Module Having Interconnect Dies", filed Nov. 15, 1997 and expressly incorporated by reference herein; and U.S. patent application Ser. No. 09/033,480, entitled "Semiconductor Die Package For Mounting In Horizontal And Upright Configurations", filed Mar. 3, 1998 and expressly incorporated by reference herein.

BACKGROUND OF THE INVENTION

1. Field of the Invention

The present invention relates to a semiconductor die package having an open cavity that exposes a semiconductor die held in the package to the environment and, more particularly, to an open-cavity semiconductor die package adapted to enable a person to place a finger tip on the semiconductor die.

2. Description of the Related Art

A semiconductor die or chip is an electrical component on which a microcircuit is built. The microcircuits can be interconnected together on the printed circuit board to form larger electrical circuits for use in radios, televisions, compact disk players, and computers, to name just a few. Because the semiconductor die is fragile, it is encased in a semiconductor die package to protect it from the environment. If one were to look inside an electronic device, such as a computer or a compact disk player, one would see one or more printed circuit boards on which semiconductor die packages are mounted and electrically interconnected.

The semiconductor die package includes a housing that holds the semiconductor die and conductive leads or pins that extend from the bottom or sides of the housing. The conductive leads are electrically connected to the semiconductor die within the housing. The outside ends of the leads are soldered to conductive paths on the printed circuit board. This secures the semiconductor die package to the printed circuit board and permits electrical signals to pass between the semiconductor die and other components on the printed circuit board.

In a conventional semiconductor die package, the housing encases the semiconductor die to prevent damage to the semiconductor die from exposure to the environment. The housing may be hermetically sealed, encased in plastic, or otherwise sealed against the environment. Some sealed packages can be opened, without damaging the semiconductor die or the wire bonding between the semiconductor die and the package leads, to allow reworking of the semiconductor die and the leads. These packages are re-sealed after reworking is completed. The process for resealing the package is complex and difficult to accomplish.

In some applications, it may be desirable to expose the semiconductor die to the environment. Some semiconductor dies are designed for use as sensors for sensing, for example, an environmental condition. As a result, at least a portion of the semiconductor dies must be exposed to the environment in order to perform sensing functions. For example, the semiconductor die may serve as a sensor for sensing a person's fingerprint for identification purposes. In this case, the person's finger must contact the semiconductor die to enable sensing. Conventional semiconductor die packages cannot be used for such applications because, as noted above, the packages are designed to encase and seal the semiconductor die to prevent exposure to the environment.

SUMMARY OF THE INVENTION

The present invention has been made in view of the above circumstances and has as an object to provide an economical semiconductor die package having an open cavity that exposes a semiconductor die held in the package to the environment.

A further object of the invention is to provide a sturdy and reliable semiconductor die package having an open cavity that exposes a semiconductor die held in the package to the environment.

A further object of the invention is to provided an economical method of manufacturing a semiconductor die package having an open cavity.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, the invention comprises a semiconductor die package having a housing defining a cavity for holding at least one semiconductor die, a plurality of electrically conductive leads, and a cover plate. The housing includes a plurality of insulative side walls and an end plate joined to the side walls. The plurality of electrically conductive leads extend through at least one of the side walls, wherein each of the leads includes an internal lead section extending within the cavity and an external lead section extending externally of the at least one side wall. The cover plate is joined to the side walls opposite the end plate and includes an aperture formed therethrough for exposing to the environment the at least one semiconductor die held in the cavity.

The invention further comprises a method of manufacturing a semiconductor die package comprising the steps of (1) forming a package assembly including a housing defining a cavity for holding at least one semiconductor die and a plurality of electrically conductive leads, the housing including a plurality of insulative side walls and an end plate joined to the side walls and the plurality of electrically conductive leads extending through at least one of the side walls, wherein each of the leads including an internal lead section extending within the cavity and an external lead section extending externally of the at least one side wall; and (2) forming a cover plate for joining to the side walls opposite the end plate, wherein the cover plate includes an aperture formed therethrough for exposing to the environment the at least one semiconductor die held in the cavity.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiment(s) of the invention and together with the description, serve to explain the principles of the invention.

DESCRIPTION OF THE PREFERRED EMBODIMENT

Reference will now be made in detail to the present exemplary embodiment(s) of the invention illustrated in the accompanying drawings. Wherever possible, the same reference numbers will be used throughout the drawings to refer to the same or like parts.

Figure 1:
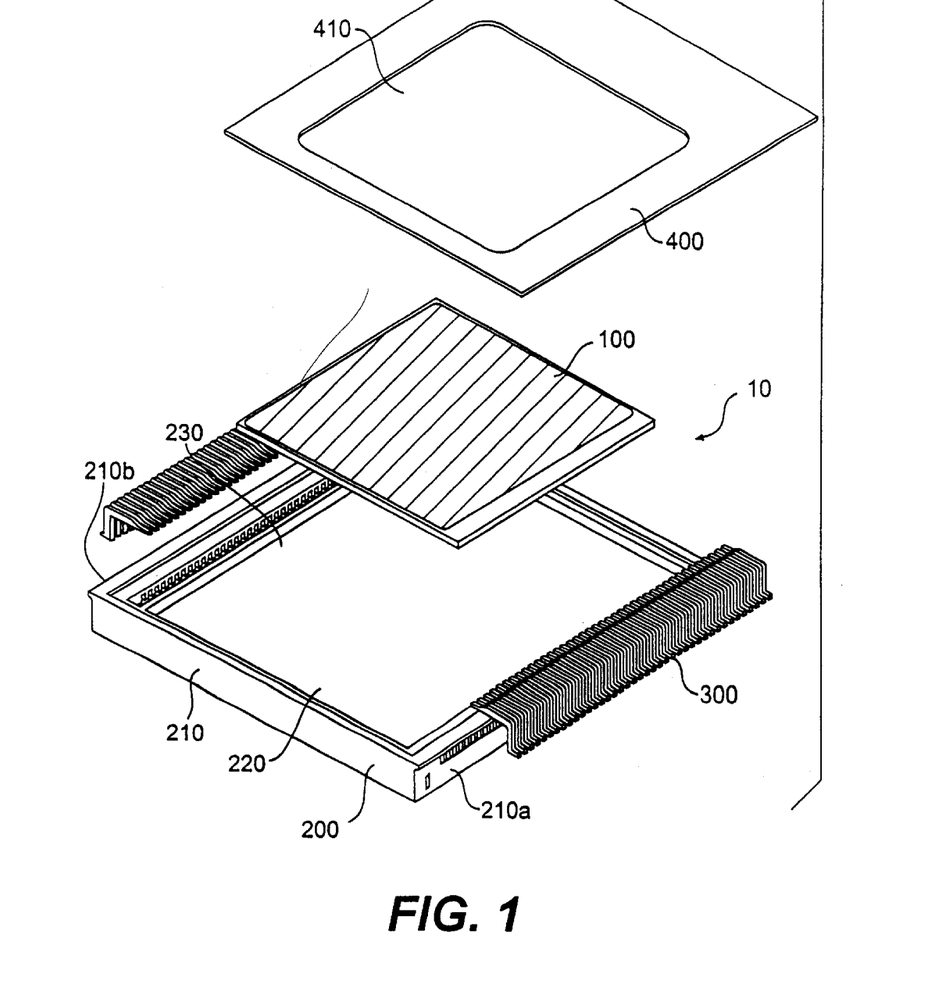
FIG. 1 provides an exploded view of an embodiment of a semiconductor die package according to the present invention.
Figure 2:
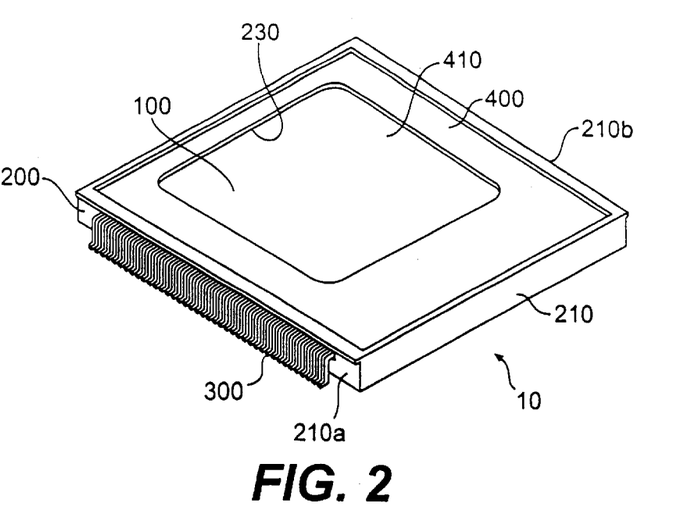
FIG. 2 shows the semiconductor die package of FIG. 1 when assembled.
Figure 3:
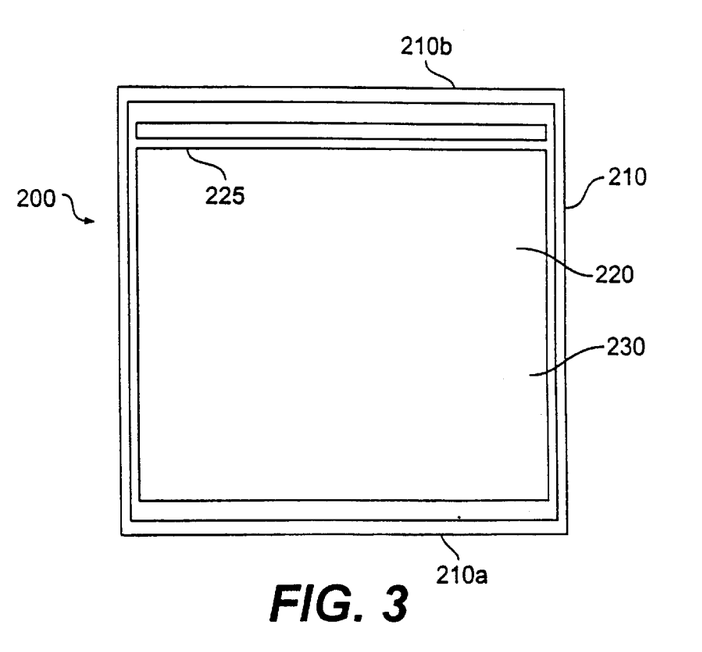
FIG. 3 shows a top view of an embodiment of a housing for the semiconductor die package shown in FIG. 1.
Figure 4:
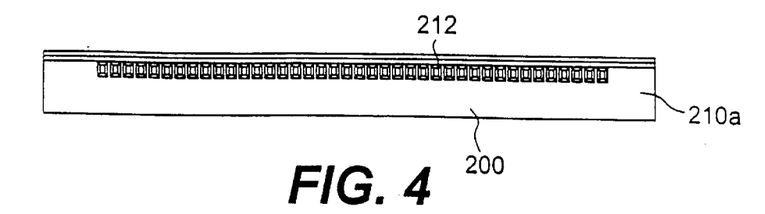
FIG. 4 shows the side of the housing depicted in FIG. 3.

FIGS. 1 and 2 illustrate one embodiment of a semiconductor die package 10 for holding a semiconductor die according to the present invention. FIG. 1 provides an exploded view of the semiconductor die package and semiconductor die shown in FIG. 2. As shown in FIGS. 1 and 2, semiconductor die package 10 includes a housing 200 for holding one or more semiconductor dies 100, leads 300 retained in the housing 200, and a cover plate 400 disposed at the top of the housing 200.

The housing 200 includes a plurality of side walls 210 and an end plate 220. As shown in FIGS. 1 and 2, leads 300 extend from the side walls 210 of housing 200. While FIG. 2 shows a single row of leads 300 extending from opposite side walls 210a and 210b of housing 200, the leads 300 may extend from any one or more of the side walls 210 and may extend from the side wall(s) 210 in one or more rows.

A cavity 230 is defined within the interior of the housing 200. One or more semiconductor dies 100 may be housed within the cavity 230, for example, by mounting to end plate 220 using an adhesive, such as an epoxy. Of course, semiconductor dies 100 may be mounted within cavity 230 by means other than adhesive and may be mounted to structure other than the end plate 220. Electrically conductive material (not shown in FIGS. 1 and 2), such as bonding wire, tape automated bonding, jumpers, and/or other electrically conductive material, may be used to electrically connect the leads 300 to the semiconductor die(s). Not all of the leads 300 need to be electrically connected to the semiconductor die. Some of leads 300 may not be connected to any electrically conductive element within the housing 200. Alternatively or in addition, some of leads 300 may be electrically connected to electromagnetic interference (EMI) or electrostatic discharge (ESD) shielding either internal or external to the housing 200, a ground or power plane included within the housing 200, or another electrical component within the housing.

An encapsulant (not shown) may cover all or part of the electrically conductive material and a portion of the semiconductor die(s). Cover plate 400 includes an aperture 410. When cover plate 400 is mounted to housing 200, aperture 410 exposes a portion of at least one of the semiconductor die(s). Accordingly, the semiconductor die package 10 has an open-cavity design in that a surface of the semiconductor die is exposed through aperture 410 in cover plate 400. In this regard, it is possible but not necessary for cavity 230 of housing 200 to be exposed through the cover plate 400. For example, the open-cavity arrangement according to the present invention may be achieved when the cover plate is flush with the surface of the semiconductor die(s), when the gap between the die(s) and the cover plate 400 is closed with encapsulant or another sealant or fitting, or when the gap between the dies(s) and the cover plate 400 is open.

Housing 200 will be described in greater detail in connection with FIGS. 3–7. As indicated above, housing 200 includes side walls 210, end plate 220, which is joined to the side walls 210, and cavity 230 for receiving one or more semiconductor dies. While in one preferred embodiment the cavity 230 receives one semiconductor die, multiple semiconductor dies may be accommodated by appropriately sizing and/or shaping the cavity 230. Cavity 230 may be defined within the interior of housing 200, for example, by the interior surfaces of the side walls 210 and end plate 220, including recesses in the end plate 220, in one or more of the side walls 210, or in both the end plate 220 and one or more of the side walls 210. Of course, cavity 230 may be defined in whole or in part by other structure located within side walls 210 and end plate 220.

Figure 5:
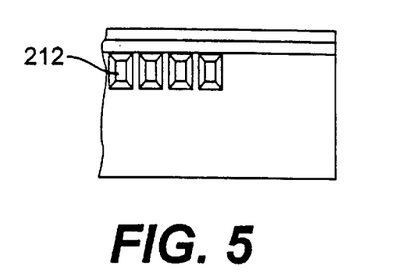
FIG. 5 shows a close-up view of the side of the housing shown in FIG. 4.

One or more of side walls 210 preferably include openings 212 formed therethrough for receiving leads 300. The openings 212 may be shaped to accommodate insertion of leads 300. As best shown in FIG. 5, openings 212 may be rectangular to receive and retain leads 300. Alternatively, openings 212 may be shaped like tombstones, i.e., generally rectangular with two square corners opposite two rounded corners, to facilitate retention and accurate positioning of the leads 300.

Figure 6:
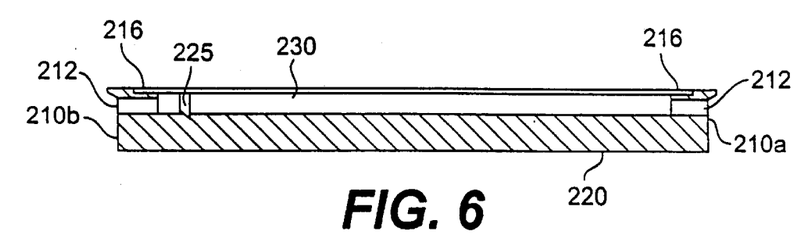
FIG. 6 shows a cross section of the housing depicted in FIG. 3.

As shown in FIG. 6, the bottom of openings 212 may be flush with the top of end plate 220. As a result, the semiconductor die(s) 100 is positioned close to the open surface of the side walls 210 to make it easier for a person to place a finger on the surface of the semiconductor die.

In the embodiment depicted in FIG. 6, the thickness of end plate 220 is substantially greater than the distance that side walls 210 extend from the end plate 220. While this arrangement is not a necessary part of the present invention, it provides several advantages when the package is used to house a fingerprint sensor die. The thick end plate 220 provides a stable and sturdy base for supporting the semiconductor die 100 and will not bend, bow, or flex when pressure is applied to the die, for example, when a person presses on the semiconductor die within the housing 200. When the package is mounted to a printed circuit board or other substrate, an adhesive, such as an epoxy, may be applied to secure the housing 200 to the substrate. Consequently, external forces applied to the package will be transferred to the substrate through the thick end plate 220 to reduce shear forces on the leads 300. The short side walls 210 provide ready access to the semiconductor die within the housing 200 for a finger and enable large surface area of the finger to contact the semiconductor die. Of course, for this or other applications, the package may have side walls 210 with a greater height to limit access to the semiconductor die or provide directional access. Further, the side walls 210 may have different heights to facilitate directional access at an angle to the semiconductor die. The dimensions of the cavity and its aperture ratio may be designed to meet the objectives of the application to which the package is used. When used as a fingerprint sensor, the cavity 230 is sized to accommodate a sensor die and to permit a finger to touch the sensor die.

An interior wall 225 maybe provided adjacent to and spaced from side wall 210*b*. The interior wall 225 may extend the entire length of the cavity. A conductive material (not shown), such as a conductive epoxy, may be introduced between the interior wall 225 and the side wall 210*b*. The interior wall 225 may serve as a dam for retaining the conductive material and preventing it from reaching the semiconductor dies. The conductive material may electrically connect together the leads 300 that extend from side wall 210*b*.

The side walls 210 and end plate 220 are preferably molded from an insulative, polymeric material, such as a liquid crystal polymer. One suitable liquid crystal polymer is VECTRA™ E 130*i*, which is available from Hoechst-Celanese. Of course, housing 200 may be made of any suitable organic or inorganic material or combination of materials. The openings 212 may be molded into the side walls 210 or may be formed after molding by removing material from the side walls 210. Further, the side walls 210 may be formed together as a single unit or, alternatively, molded separately and then joined together using an adhesive or other suitable means. The end plate 220 may be molded together with the side walls 210 to form a single one-piece unit, or the end plate 220 may be formed separately and then attached. FIGS. 3–7 show an embodiment of housing 200 having a single material, one-piece molded construction of side walls 210 and end plate 220. Of course, the side walls 210 and end plate 220 may be made from different materials.

The semiconductor die or dies may be mounted directly to the end plate 220 using an adhesive. A platform (not shown) for mounting the semiconductor die may be formed as part of the end plate 220 or formed separately and attached as part of the end plate. The platform may be used to adjust the level of the top surface of the semiconductor die(s) relative to the leads 300, the side walls 210, and/or the cover plate 400.

Figure 7:
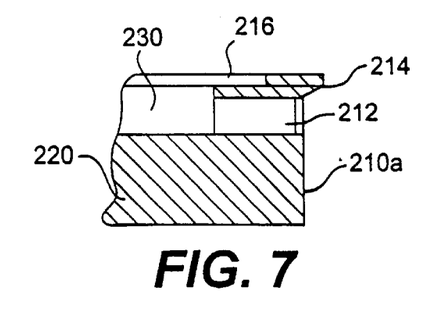
FIG. 7 shows a close-up view of the cross section of the housing shown in FIG. 6.

As shown in FIGS. 6 and 7, side walls 210*a* and 210*b* may include an exterior lip 214 along an upper edge thereof. In addition, the top of the side walls 210 may include a recess 216 for receiving the cover plate 400. An adhesive may be applied to the recess and/or the edges of the cover plate 400 to secure the cover plate 400 to the housing 200. Other mechanisms for mounting the cover plate 400 to the housing 200 may be used as well, for example, the cover plate 400 may be adhered to the housing 200 without the use of a recess, the cover plate 400 may clip or snap to the housing 200, be press fit, or heat sealed, or be permanently or removably attached by other means.

FIG. 7 provides a detailed view of the openings 212 in the housing 200. As shown, the exterior end of the opening 212 is flared to guide leads 300 into the opening 212 during insertion. In a preferred embodiment, the leads 300 are inserted into preformed openings 212 in the housing 200. As an alternative, housing 200 may be molded around leads 300, for example, by injection molding techniques.

Figure 8:
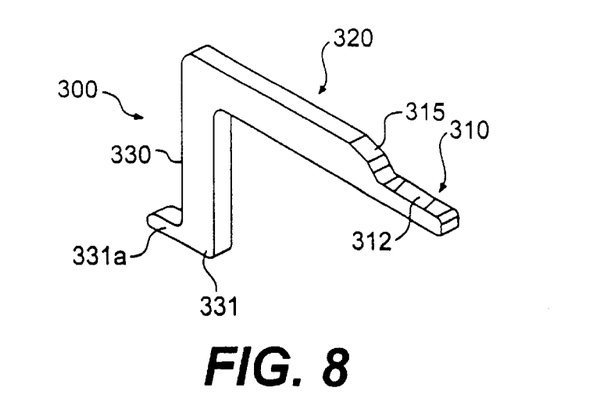
FIGS. 8, 9, and 10 illustrate various views of an embodiment of a lead for use in the semiconductor die carrier shown in FIG. 1.
Figure 9:
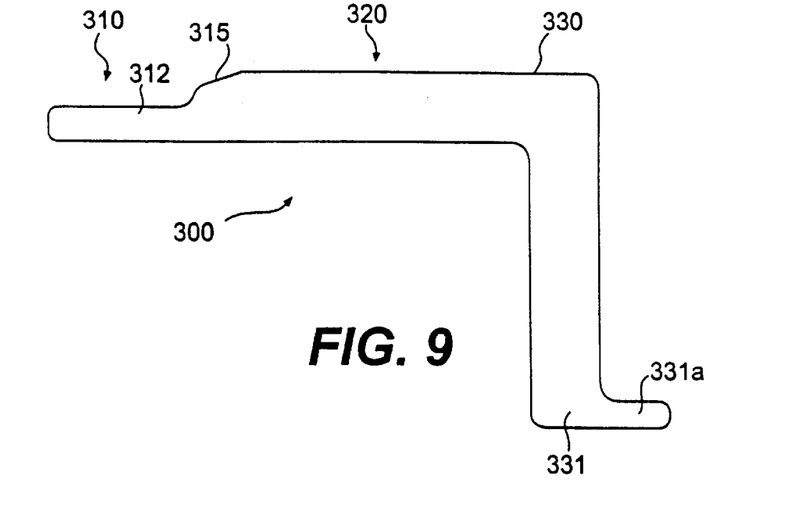
Figure 10:
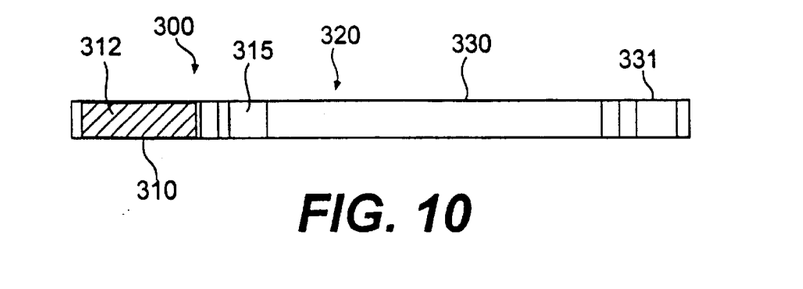

FIGS. 8, 9, and 10 illustrate one embodiment of the conductive leads 300. As shown in FIGS. 8 and 9, the conductive leads 300 are generally L-shaped. The conductive leads 300 each include an internal lead section 310, a stabilizing section 320, and an external lead section 330. The internal lead section 310 resides inside the housing 200 to facilitate direct or indirect connection to the semiconductor die(s) or other electrical components within the housing 200. The internal lead section 310 may be relatively narrow compared to the stabilizing section 320 to facilitate insertion of the lead 300 into the opening 212 of the housing 200. A sloping transitional section 315 couples the internal lead section 310 to the stabilizing section 320. Sloping transitional section 315 prevents the lead from digging into the housing 200 upon insertion. The internal lead section 310 may include a flat bonding surface 312 for contacting electrically conductive material used to connect the leads to the semiconductor die(s). The bonding surface 312 may be plated with gold or another highly conductive material to ensure a reliable electrical connection. If a particular lead 300 is not intended to be used for establishing an electrical connection, the bonding surface 312 need not be formed.

In one preferred embodiment, stabilizing section 320 frictionally engages the inner walls of housing 200 within opening 212. The strength of the frictional engagement may be sufficient to retain lead 300 in housing 200. Alternatively, the leads 300 may be bonded to the housing 200 using a suitable adhesive. Further, the housing 200, or just the side walls 210, may be molded around the leads 300. In a preferred embodiment, the stabilizing section 320 has a rectangular cross section with its height greater than its width. When the opening 212 is tombstone-shaped, the rounded corners of the opening 212 force the sides of stabilizing section 320 against the flat sides of the opening 212, which are opposite the rounded corners, to accurately position the lead 300 against the end plate 220. In addition, the corners of the stabilizing section 320 of the lead 300 press into the rounded corners of the opening 212 to help secure the lead 300.

The external lead section 330 extends from the side wall 210 of the housing 200 and may have the same axial dimensions as the stabilizing section 320 to produce a robust, rigid lead that is difficult to bend. The leads 300 may be arranged in multiple, vertically spaced rows or tiers through the side walls 210 and may extend from one or more of the side walls 210. The generally L-shaped leads 300 are designed for surface mounting to a printed circuit board or other substrate. The external lead section includes a foot portion 331 at an end distal to the housing 200. The foot portion 331 facilitates surface mounting to bonding pads on the surface of a substrate, for example a printed circuit board.

Further, leads 300 are shown to have a toe 331a on foot portion 331. The toe 331a increases the soldering space and provides a toe geometry for a standard TQFP open top socket. Of course, the toe 331a may be omitted or replaced by other end configurations. Rather than a foot portion, the distal end of the external lead section 330 may have a butt end, a curled end, or a gull wing configuration. Alternatively, the external lead section 330 may be adapted to connect to a printed circuit board or other substrate by other means, such as, for example, plated through hole (PTH) technology.

The leads 300 are preferably stamped from a metal blank into an L-shape and then finished by machining. In this way, the leads 300 are extremely rigid because they are not bent or designed to be bent during manufacture. Accordingly, leads 300 resist bending when mounted to a substrate, such as a printed circuit board, and provide a sturdy, stable connection. This is particularly important in a fingerprint sensor application, where the stress of repeated pressure must be absorbed without bending or breaking.

Figure 11:
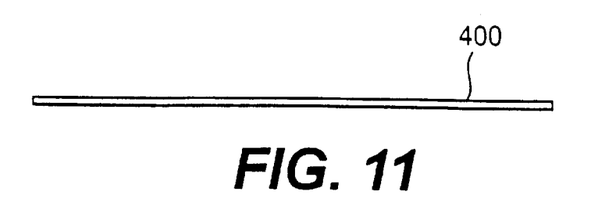
FIG. 11 illustrates the side of an embodiment of a cover plate for use with semiconductor die package shown in FIG. 1.
Figure 12:
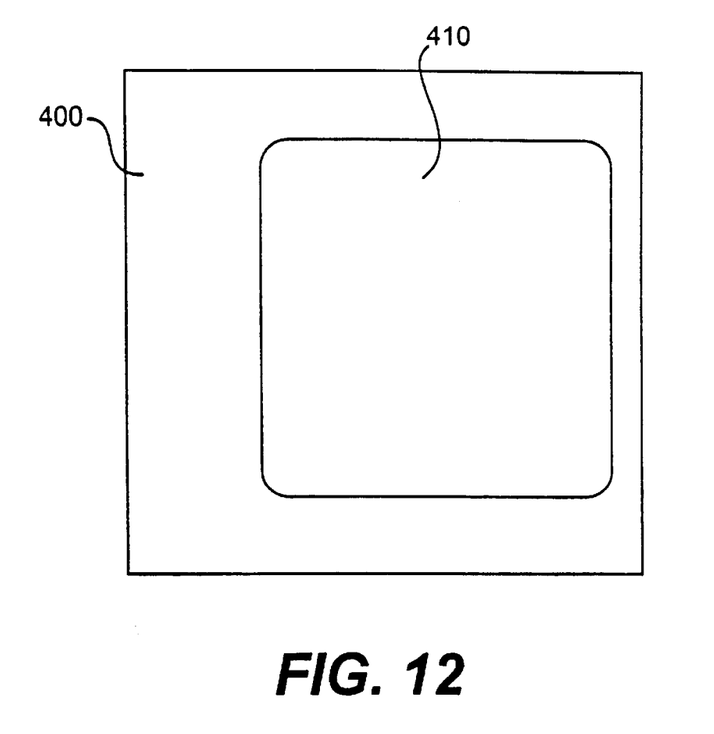
FIG. 12 shows the top of the cover plate shown in FIG. 11.

FIGS. 11 and 12 illustrate the cover plate 400. As shown from the side in FIG. 11, the cover plate 400 may be flat to facilitate reception into the recess 216 of the housing 200. In the alternative, the cover plate 400 may include lips, apertures, or protrusions, for example, to aid in mounting to the housing 200. Also, the cover plate 400 is thin to limit the distance between the environment and the semiconductor die and so that a large area of the finger may touch the semiconductor die. For example, the cover plate 400 may have a thickness of 0.008 inches (3.1 mm) or less. While FIG. 12 shows aperture 410 to be slightly off center, this is not necessary for the present invention. The size, shape, location, and number of the apertures through cover plate 400 may be selected based on the area, location, and number of dies to be exposed. In some applications, the cover plate 400 may be made of a conductive material, for example copper or another conductive metal. For example, in a package designed for use as a fingerprint sensor, a conductive material may be used to form the cover plate 400 to discharge static from a person's finger prior to touching the semiconductor die(s).

Figure 13:
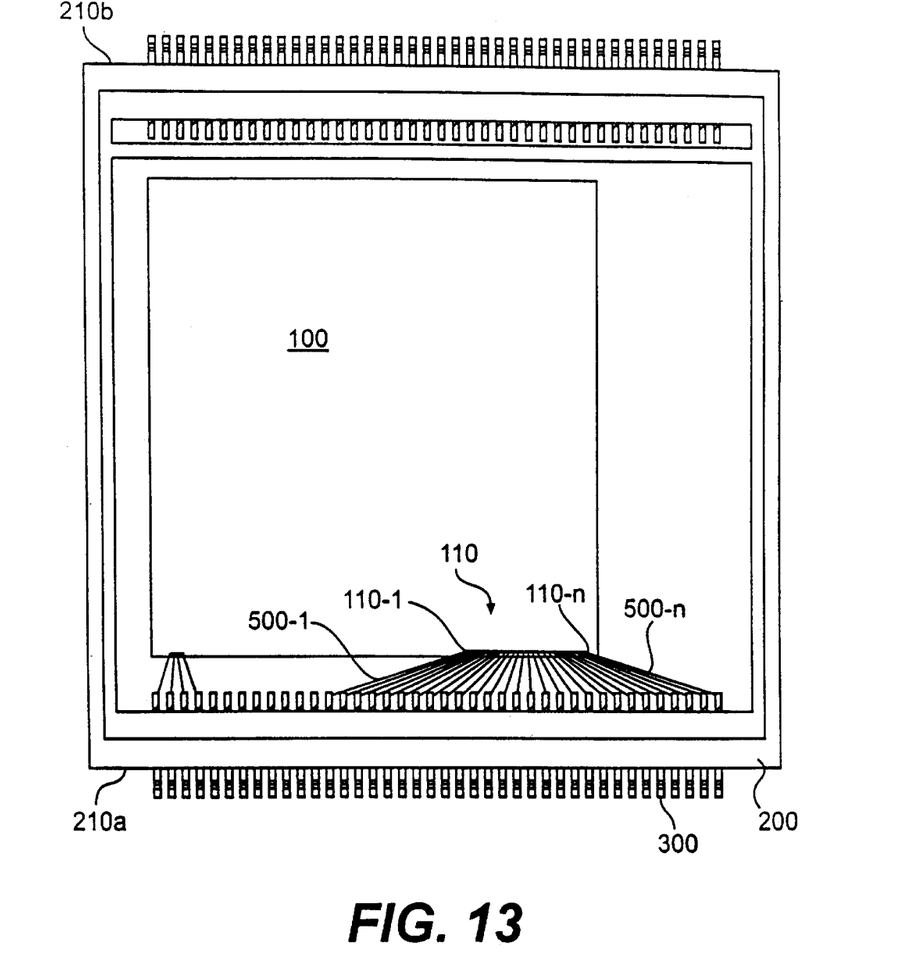
FIG. 13 depicts a bonding arrangement for use in the semiconductor die package of FIG. 1.

FIG. 13 illustrates one embodiment for electrically connecting a semiconductor die 100 to leads 300. Other arrangements may be used as well and the arrangement shown in FIG. 13 should not be considered to limit the present invention. Further, while FIG. 13 shows a single semiconductor die 100 mounted directly to end plate 220, it should be understood that multiple semiconductor dies 100 may be mounted within housing 200. Rather than direct mounting to the end plate 220, the semiconductor die(s) may be mounted to an intervening substrate, which may be electrically active, such as a ceramic substrate or circuit board. Housing 200 may also include one or more interconnect dies as disclosed in U.S. patent application Ser. No. 08/970,379, entitled "Multi-Chip Module Having Interconnect Dies", filed Nov. 15, 1997 and expressly incorporated by reference herein.

As shown in FIG. 13, electrically conductive material 500 is used to interconnect the leads 300 to bonding pads formed at the periphery of the semiconductor die 100. The electrically conductive material 500 may be, for example, wire bonding, tape automated bonding (TAB), conductive traces on insulated substrates, interconnect dies, and jumper wires, among others and/or a combination thereof. FIG. 13 shows the electrically conductive material 500 as a direct wire bonding between leads 300 and the semiconductor die 100. The electrically conductive material 500 preferably contacts the bonding surfaces 312 of the leads 300 to establish a good electrical connection.

FIG. 13 shows that the semiconductor die 100 is not centered on the end plate 220 of housing 200. This arrangement is adapted for the semiconductor die 100, which includes a concentration of bonding pads 110 at the right hand side of the lower peripheral area. The semiconductor die is mounted so as to center the bonding pads 110 at the right hand side of the lower peripheral area to corresponding leads 300 for electrical connection. Therefore, the length of the wire bonding connection 500-1 for electrically connecting to a bonding pad 110-1 at a first end of the bonding pads 110 is substantially the same length as a wire bonding connection 500-n for electrically connecting to a bonding pad 110-n at a second end of the bonding pads 110. As a result, the wire bonding connections 500-1 to 500-n are balanced. This arrangement is not a necessary part of the present invention. Alternatively, the semiconductor die 100 may be centered when mounted within housing 200, and the electrical connections may be established according to known techniques.

The leads 300 extending from side wall 210b of FIG. 13 are not electrically connected to the semiconductor die 100. Some or all of these leads 300 may be electrically isolated and used solely to provide a stable mount to the printed circuit board or other substrate to which the package is mounted. One or more of the leads 300 may be connected to a ground plane, a power plane, or EMI or ESD shielding. Further, others of the leads 300 may be connected to the semiconductor die, either directly or indirectly. In one preferred embodiment, leads 300 extending from side wall 210b are electrically connected together using a conductive epoxy or paste and are connected to EMI shielding housed within the housing 200 or ESD shielding on the outside of the housing 200. Note that the conductive epoxy or paste may be used to couple the leads to the cover plate 400, thereby providing an ESD discharge path from the cover plate, through the epoxy or paste, through the leads, and to a ground on the PCB.

Figure 14:
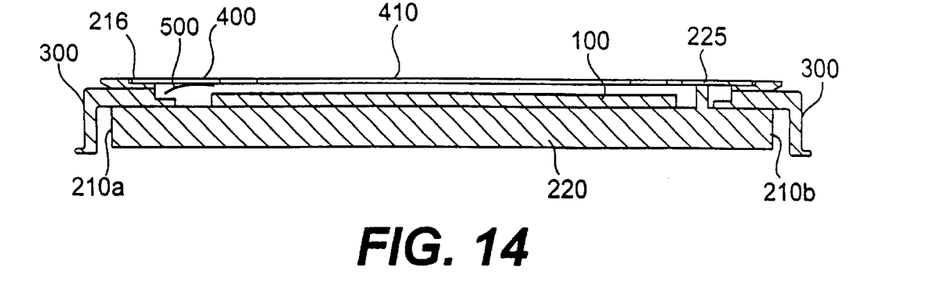
FIG. 14 illustrates a cross section of the semiconductor die package having a bonding arrangement as shown in FIG. 13.
Figure 15:
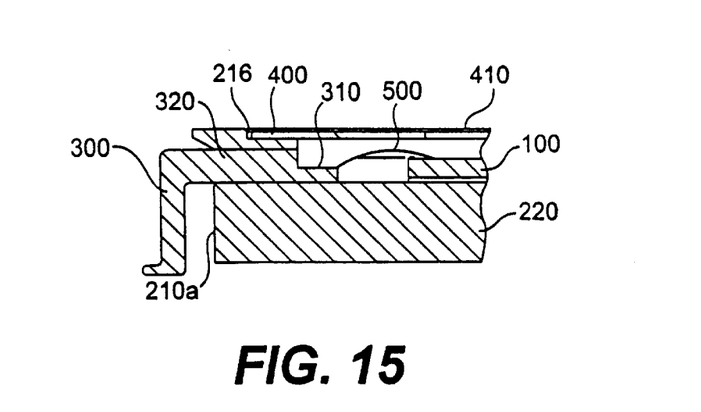
FIG. 15 shows a close-up view of the cross section of the semiconductor die package shown in FIG. 14.

FIG. 14 illustrates a cross section of the semiconductor die package having the bonding arrangement shown in FIG. 13. FIG. 15 illustrates a close-up view of FIG. 14. As shown in FIGS. 14 and 15, cover plate 400 seats within recess 216 at the top of side walls 210 and on the top of interior wall 225. As shown, the interior wall 225 isolates the leads 300 that extend through side wall 210b. The bonding surface 312 of the internal lead section 310 may be positioned below the active surface of the semiconductor die 100 so that the active surface of the semiconductor die 100 may be located closer to the cover plate 400. Electrically conductive material 500 connects the internal lead section 310 of leads 300 to bonding pads on the semiconductor die 100. The external lead section of leads 300 extend from side walls 210a and 210b for surface mounting to a substrate, such as a printed circuit board. As shown, the bottom surface of the foot portion may extend slightly below the bottom surface of the housing 200. This provides clearance for an adhesive, for example, an epoxy, to be applied to the bottom surface of the housing 200 to secure the housing to the printed circuit board or other substrate to which the package is mounted. The aperture 410 is located to expose a portion of semiconductor die 100 to the environment.

After electrically connecting the semiconductor die(s) to the leads 300, an encapsulant may be used to seal all or a portion of the internal lead sections 310 of leads 300, the electrically conductive material 500, and a portion of the semiconductor die(s) to which the electrically conductive material is connected. In such as case, the encapsulant may bond to the portion of leads 300 that is exposed within the housing 200.

Figure 16:
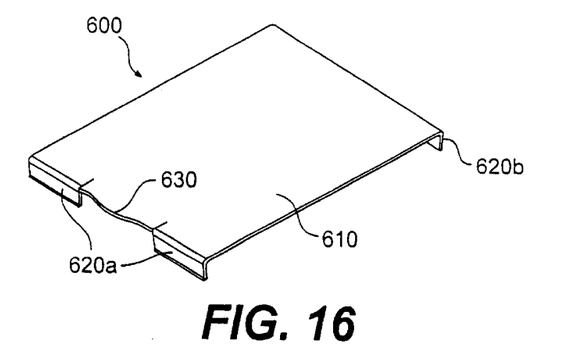
FIGS. 16, 17, and 18 show views of a cap for a semiconductor die package according to FIG. 1.
Figure 17:
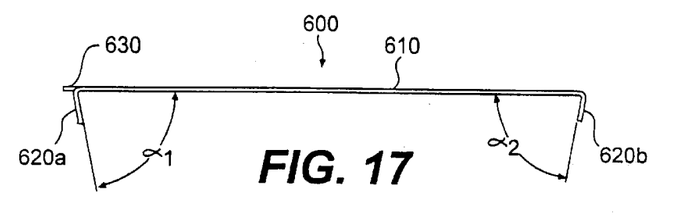
Figure 18:
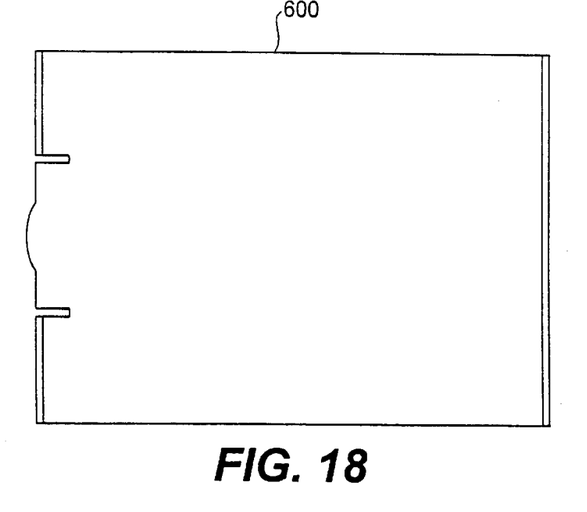

FIGS. 16 and 17 illustrate various views of an optional cap 600 for the semiconductor die package 10. The cap 600 fits over the housing 200 and cover plate 400, and thereby closes aperture 410 to protect the semiconductor die package 10 after packaging and during reflow processes. In one embodiment, the cap 600 may be snapped on to the top of package 10. Alternatively, the cap 600 may be removably secured to the package 10 by other means. For example, the cap 600 may slide on and off the housing 200 or cover plate 400. Alternatively, the cap 600 may be attached to the housing 200 or cover plate 400 using a hinge (not shown). In this case, the cap 600 may swing open to expose the semiconductor die(s) when needed.

In the embodiment shown in FIGS. 16 and 17, cap 600 includes a top surface 610 and two spring sides 620$a$ and 620$b$ for holding the side walls 210 to removably retain the cap 600 to the package 10. The top surface 610 may be generally flat but with a slight curvature such that a pick-and-place assembly machine can pick the cap 600 and package 10 and place it on the solder pads of a substrate.

The cap 600 may be made of a resilient material, for example, stainless steel, to provide a spring force to sides 620$a$ and 620$b$. As shown in FIG. 17, the sides 620$a$ and 620$b$ form angles $\alpha_1$ and $\alpha_2$ to the top surface 610. Angles $\alpha_1$ and $\alpha_2$ may be the same or different. Angles $\alpha_1$ and $\alpha_2$ may be, for example, 80°. After the leads of the package 10 are soldered, the cap 600 can be removed using the handle 630. The cap 600 may be reusable or disposable.

After the semiconductor die(s) 100 are mounted within the housing 200 and electrically connected (e.g., wire bonded) to leads 300, the cover plate 400 is secured to the top of the housing 200. In certain applications, the semiconductor die 100 may be exposed after packaging to function as a sensor. When the leads 300 are soldered to a printed circuit board or other substrate, the package 10 will be exposed to a high temperature reflow process, which may damage the exposed semiconductor die 100. Cap 600 may be fit over the housing 200 to close the aperture in the cover plate 400 and protect the semiconductor die 100 during this reflow process and other related processes, such as aqueous cascade washing and/or hot air drying. The cap 600 shields the semiconductor die from the impact of cleaning solutions, blown air, and other processing or environmental conditions that might damage the die(s). Of course, the cap 600 may be used to protect the semiconductor die at other times as well, but may be removed for sensing.

It will be apparent to those skilled in the art that various modifications and variations can be made without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of manufacturing a semiconductor die package comprising:

forming a housing defining a cavity for holding at least one semiconductor die, said housing including a plurality of insulative side walls and an end plate joined to said side walls, wherein the thickness of the end plate is greater than the distance that the side walls extend away from the end plate;

inserting a plurality of electrically conductive leads extending through at least one of said side walls, each of said leads including an internal lead section extending within the cavity and an external lead section extending externally of said at least one side wall; and providing a cover plate joined to said side walls opposite said end plate, wherein said cover plate includes an aperture formed therethrough which exposes to the environment a sufficient portion of said at least one semiconductor die such that pressing a human digit into said aperture results in contact between said human digit and said at least one semiconductor die.

2. A method of manufacturing a semiconductor die package according to claim 1, wherein the side walls and the end plate are molded together to form a one-piece structure.

3. A method of manufacturing a semiconductor die package according to claim 1, wherein said cover plate is made of a conductive material.

4. A method of manufacturing a semiconductor die package according to claim 3, wherein said cover plate forms part of an electrostatic discharge path.

5. A method of manufacturing a semiconductor die package according to claim 4, wherein said cover plate and the internal lead section of at least one of said leads are electrically connected by a conductive material.

6. A method of manufacturing a semiconductor die package according to claim 1, wherein said cover plate has an outer circumference greater than the outer circumference of the at least one semiconductor die.

7. A method of manufacturing a semiconductor die package comprising:

forming a housing defining a cavity for holding a semiconductor die, the housing including a plurality of insulative side walls and an end plate joined to said side walls, wherein the housing includes an aperture formed therethrough for exposing a majority of a surface of the semiconductor die to ambient and an electrically conductive cover plate that defines the aperture;

inserting a plurality of electrically conductive leads extending through at least one of said side walls, each of said leads including an internal lead section extending within the cavity and an external lead section extending externally of said at least one side wall; and providing a cap that fits over said housing to close the aperture from ambient, the cap being removably secured to the housing.

8. A method of manufacturing a semiconductor die package according to claim 7, wherein said leads are L-shaped.

9. A method of manufacturing a semiconductor die package according to claim 7, wherein said cover plate forms part of an electrostatic discharge path.

10. A method of manufacturing a semiconductor die package according to claim 7, wherein the cap includes a plurality of clips for detachably securing the cap to the housing.

11. A method of manufacturing a semiconductor die package according to claim 7, wherein the cap is made from stainless steel.

* * * * *